(12) United States Patent  
Park et al.

(10) Patent No.: US 7,986,551 B2
(45) Date of Patent: Jul. 26, 2011

(54) PHASE CHANGE RANDOM ACCESS MEMORY DEVICE

(75) Inventors: Mu-hui Park, Seoul (KR); Beak-hyung Cho, Hwaseong-si (KR); Hyung-rok Oh, Yongin-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 7 days.

(21) Appl. No.: 12/690,999

(22) Filed: Jan. 21, 2010

(65) Prior Publication Data

US 2010/0118601 A1    May 13, 2010

Related U.S. Application Data

(62) Division of application No. 11/850,125, filed on Sep. 5, 2007, now Pat. No. 7,672,156.

(30) Foreign Application Priority Data

Sep. 11, 2006 (KR) ................. 10-2006-0087630

(51) Int. Cl.
*G11C 11/00* (2006.01)
(52) U.S. Cl. ........................... 365/163; 365/148
(58) Field of Classification Search ............... 365/46, 365/94, 100, 113, 148, 163; 257/2–5, 296, 257/E31.047, E27.006; 438/29, 95, 96, 166, 365, 482, 486, 597

See application file for complete search history.

(56) References Cited

U.S. PATENT DOCUMENTS

| 6,625,054 B2 | 9/2003 | Lowrey et al. | |
| 6,930,909 B2 * | 8/2005 | Moore et al. | 365/148 |
| 2004/0264234 A1 * | 12/2004 | Moore et al. | 365/148 |

FOREIGN PATENT DOCUMENTS

| KR | 1020040105008 A | 12/2004 |
| KR | 1020050017352 A | 2/2005 |
| KR | 1020050046041 A | 5/2005 |
| KR | 1020050070700 A | 7/2005 |
| KR | 1020050079030 A | 8/2005 |
| KR | 1020050089500 A | 9/2005 |
| KR | 1020050107199 A | 11/2005 |
| KR | 1020060004289 A | 1/2006 |

* cited by examiner

*Primary Examiner* — Richard Elms
*Assistant Examiner* — Harry W Byrne
(74) *Attorney, Agent, or Firm* — Volentine & Whitt, PLLC

(57) ABSTRACT

In a phase-change random access memory (PRAM) device, a write operation is performed by applying a set pulse to failed PRAM cells. The set pulse comprises a plurality of stages sequentially decreasing from a first current magnitude to a second current magnitude. The first current magnitude or the second current magnitude varies from one write loop to another.

5 Claims, 14 Drawing Sheets

PHASE CHANGE RANDOM ACCESS MEMORY DEVICE

CROSS-REFERENCE TO RELATED APPLICATIONS

This is a divisional of application Ser. No. 11/850,125 filed on Sep. 5, 2007, which claims the priority of Korean Patent Application No. 10-2006-0087630, filed on Sep. 11, 2006. The subject matter of both of these applications is hereby incorporated by reference in their entirety.

BACKGROUND OF THE INVENTION

1. Field of the Invention

Embodiments of the invention relate generally to phase-change random access memory (PRAM) devices and associated operating characteristics. More particularly, embodiments of the invention relate to PRAM devices employing write verify operations.

2. Description of Related Art

Phase-change memory devices store data using phase-change materials, such as chalcogenide, which are capable of stably transitioning between amorphous and crystalline phases. The amorphous and crystalline phases (or states) exhibit different resistance values, which are used to distinguish different logic states of memory cells in the memory devices. In particular, the amorphous phase exhibits a relatively high resistance, and the crystalline phase exhibits a relatively low resistance.

At least one type of phase-change memory device—phase-change random access memory (PRAM)—uses the amorphous state to represent a logical '1' and the crystalline state to represent a logical '0'. In a PRAM device, the crystalline state is referred to as a "set state", and the amorphous state is referred to as a "reset state". Accordingly, a memory cell in a PRAM stores a logical '0' by "setting" a phase-change material in the memory cell to the crystalline state, and the memory cell stores a logical '1' by "resetting" the phase-change material to the amorphous state. Various PRAM devices are disclosed, for example, in U.S. Pat. Nos. 6,487,113 and 6,480,438.

The phase-change material in a PRAM is converted to the amorphous state by heating the material to above a predetermined melting temperature and then quickly cooling the material. The phase-change material is converted to the crystalline state by heating the material at another predetermined temperature below the melting temperature but above a crystallization temperature for a set period of time. Accordingly, data is written to memory cells in a PRAM by converting the phase-change material in memory cells of the PRAM between the amorphous and crystalline states using heating and cooling as described.

The phase-change material in a PRAM typically comprises a compound including germanium (Ge), antimony (Sb), and tellurium (Te), i.e., a "GST" compound. The GST compound is well suited for a PRAM because it can quickly transition between the amorphous and crystalline states by heating and cooling. Examples of other compounds that could be used for the phase-change material include, but are not limited to, 2-element compounds such as GaSb, InSb, InSe, $Sb_2Te_3$, and GeTe, 3-element compounds such as GeSbTe, GaSeTe, InSbTe, $SnSb_2Te_4$, and InSbGe, or 4-element compounds such as AgInSbTe, (GeSn)SbTe, GeSb(SeTe), and $Te_{81}Ge_{15}Sb_2S_2$.

The memory cells in a PRAM are commonly referred to as "phase-change memory cells", or PRAM cells. A phase-change memory cell typically comprises a top electrode, a chalcogenide layer, a bottom electrode contact, a bottom electrode, and an access transistor. In the phase-change memory cell, the chalcogenide layer is typically the phase-change material. Accordingly, a read operation is performed on the phase-change memory cell by measuring the resistance of the chalcogenide layer, and a write operation is performed on the phase-change memory cell by heating and cooling the chalcogenide layer as described above.

In order to enhance the reliability of write operations performed in PRAM devices, a write verify operation (also called a verify read operation) is often performed before or after a write operation to detect whether selected PRAM cells are in desired states. In the write verify operation, data stored in the selected PRAM cells is read out from the selected PRAM cells as verification data. The verification data is then compared with data to be written in the selected PRAM cells (also referred to as write data).

Differences between the verification data and the write data are then used to detect PRAM cells that have not been successfully written (also referred to as "failed cells" or "failed PRAM cells"). The failed cells are then re-written using corresponding bits among the write data, while selected PRAM cells that have been successfully written-to may not be re-written with corresponding bits among the write data.

The re-writing (as well as initial writing) is generally accomplished using a plurality of write loops each preceded by a write verify operation. Typically, a write loop will only be performed if the preceding write verify operation indicates that at least one selected PRAM cell has not been successfully written with the corresponding write data.

SUMMARY OF THE INVENTION

Selected embodiments of the invention provide PRAM devices capable of performing write operations with improved reliability relative to conventional PRAM devices.

According to embodiment of the invention, a phase-change random access memory (PRAM) device comprises a memory cell array and a write circuit. The memory cell array comprises a plurality of PRAM cells. The write circuit is configured to write data to at least one failed PRAM cell among the PRAM cells by providing the at least one failed PRAM cell with a set pulse or a reset pulse during each of a plurality of write loops. The set pulse comprises a plurality of stages sequentially decreasing from a first current magnitude to a second current magnitude, and the first current magnitude or the second current magnitude varies from one write loop to another.

According to another embodiment of the invention, a phase-change random access memory (PRAM) device comprises a memory cell array and a write circuit. The memory cell array comprises a plurality of PRAM cells. The write circuit writes data to at least one failed PRAM cell among the PRAM cells by providing the at least one failed PRAM cell with a set pulse or a reset pulse during each of a plurality of write loops, wherein the set pulse has a current magnitude that varies from one write loop to another.

According to still another embodiment of the invention, a phase-change random access memory (PRAM) device comprises a register, a level control signal provider, a set controller, and a write driver. The register is configured to sequentially generate a plurality of control pulses having respective active periods that do not coincide. The level control signal provider receives a write loop signal indicating an n-th write loop, and provides a level control signal corresponding to the n-th write loop. The set controller sequentially receives the control pulses and receives the level control signal, generates a set control signal comprising a plurality of stages sequentially decreasing from a first voltage level to a second voltage level, and varies the first voltage level or the second voltage level in response to the level control signal. The write driver provides a set pulse where write data to be written in the PRAM device is set data, and provides a reset pulse where the write data is reset data. The set pulse comprises a plurality of stages sequentially decreasing from a first current magnitude to a second current magnitude, wherein the first or second current magnitude varies from one write loop to another.

BRIEF DESCRIPTION OF THE DRAWINGS

Embodiments of the invention are described below in relation to the accompanying drawings. Throughout the drawings like reference numbers indicate like exemplary elements, components, and steps. In the drawings.

DESCRIPTION OF EXEMPLARY EMBODIMENTS

Exemplary embodiments of the invention are described below with reference to the corresponding drawings. These embodiments are presented as teaching examples while the actual scope of the invention is defined by the claims that follow.

Figure 1:
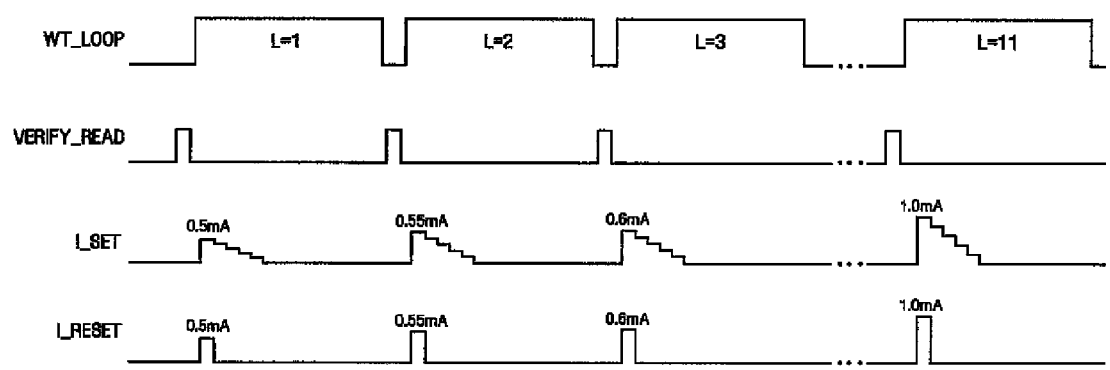
FIG. 1 is a timing diagram for explaining the operation of a PRAM device according to an embodiment of the invention.

FIG. 1 is a timing diagram for explaining the operation of a PRAM device according to an embodiment of the invention. Referring to FIG. 1, the PRAM device writes write data to selected PRAM cells using a plurality of write loops (L=1-11).

The PRAM device performs a verify read operation (VERIFY_READ) before each of the write loops (L=1-11). During each of the write loops (L=1-11), the PRAM device writes write data to at least one failed PRAM cell based on the verify read operation.

In order to write the write data to a failed PRAM cell, a set pulse I_SET or a reset pulse I_RESET is applied to the failed PRAM cell such that current flows through the failed PRAM cell. According to selected embodiments of the invention, set pulse I_SET and reset pulse I_RESET are current pulses having different magnitudes during different write loops among the write loops (L=1-11). Accordingly, different amounts of current may flow through failed PRAM cell during the different write loops.

Figure 2:
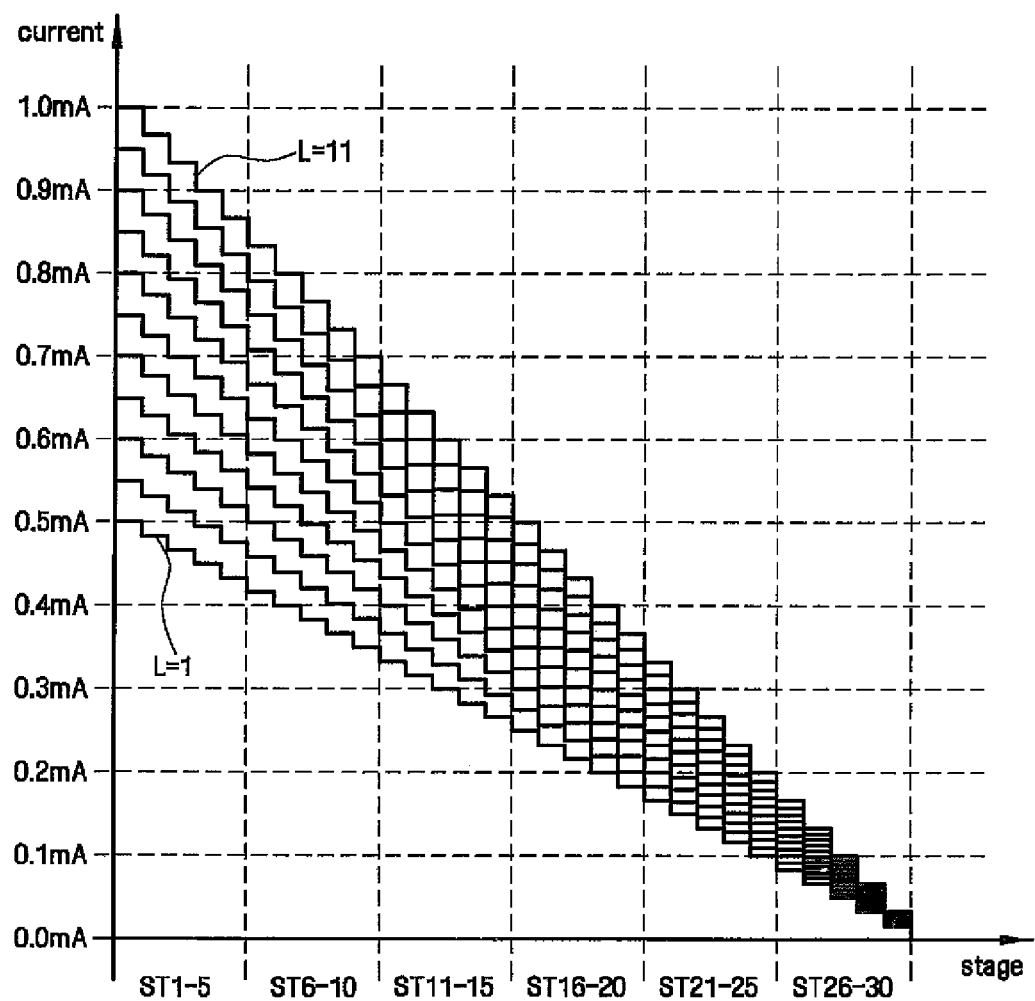
FIGS. 2 through 4 are graphs illustrating set pulses used in write operations of a PRAM device according to selected embodiments of the invention.
Figure 3:
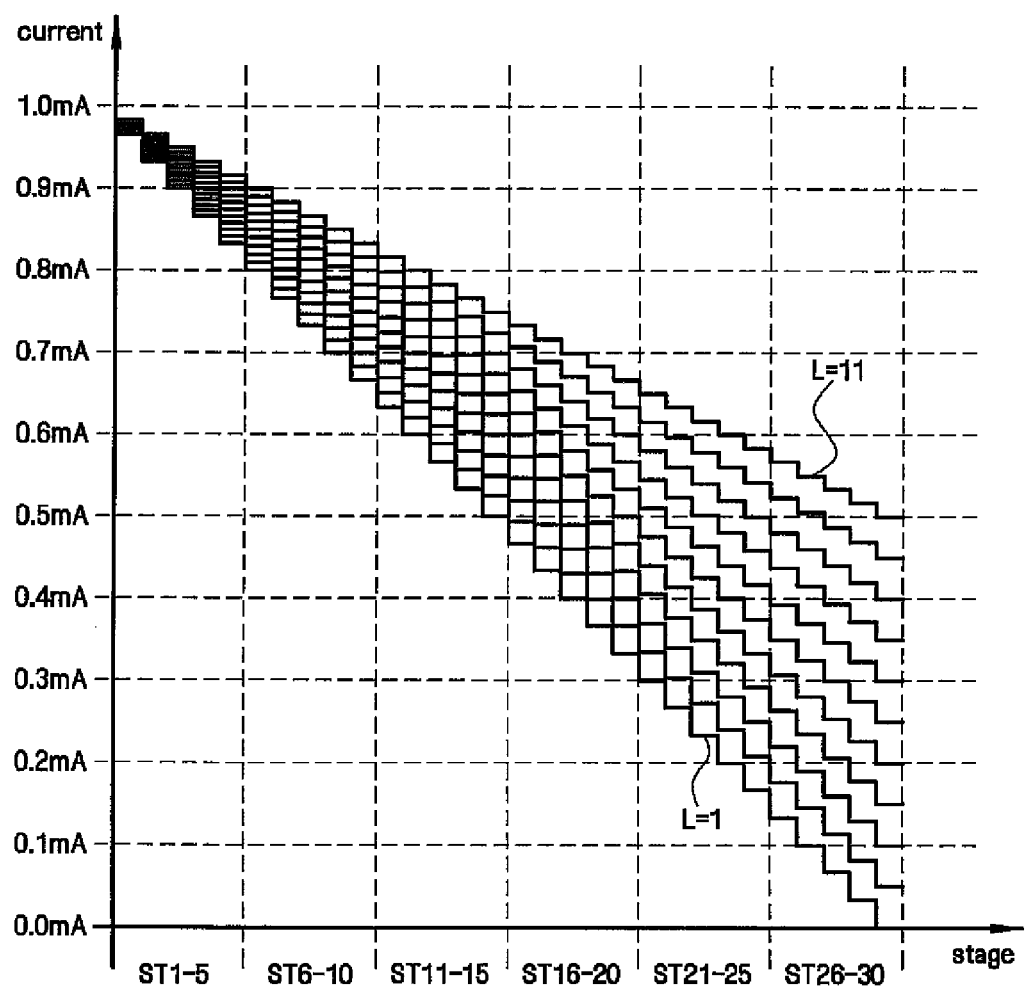
Figure 4:
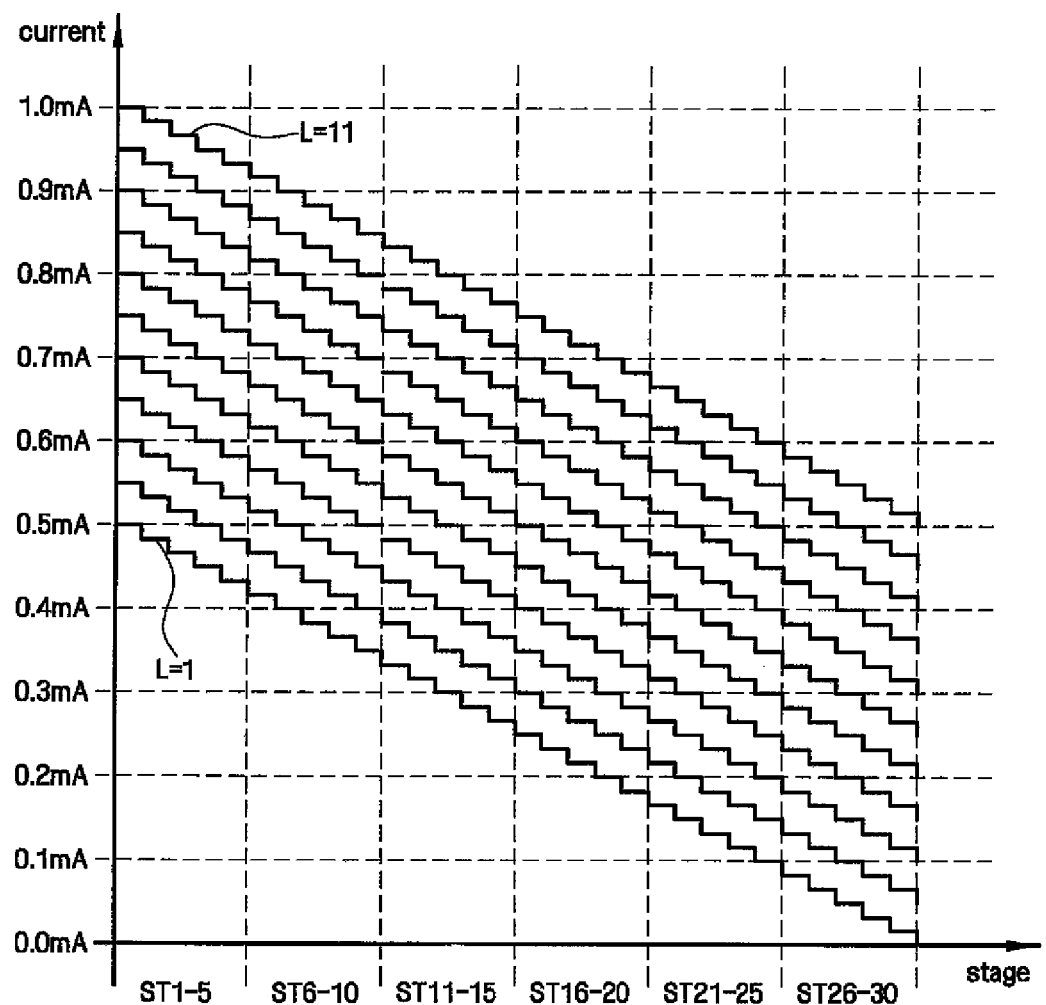
Figure 5:
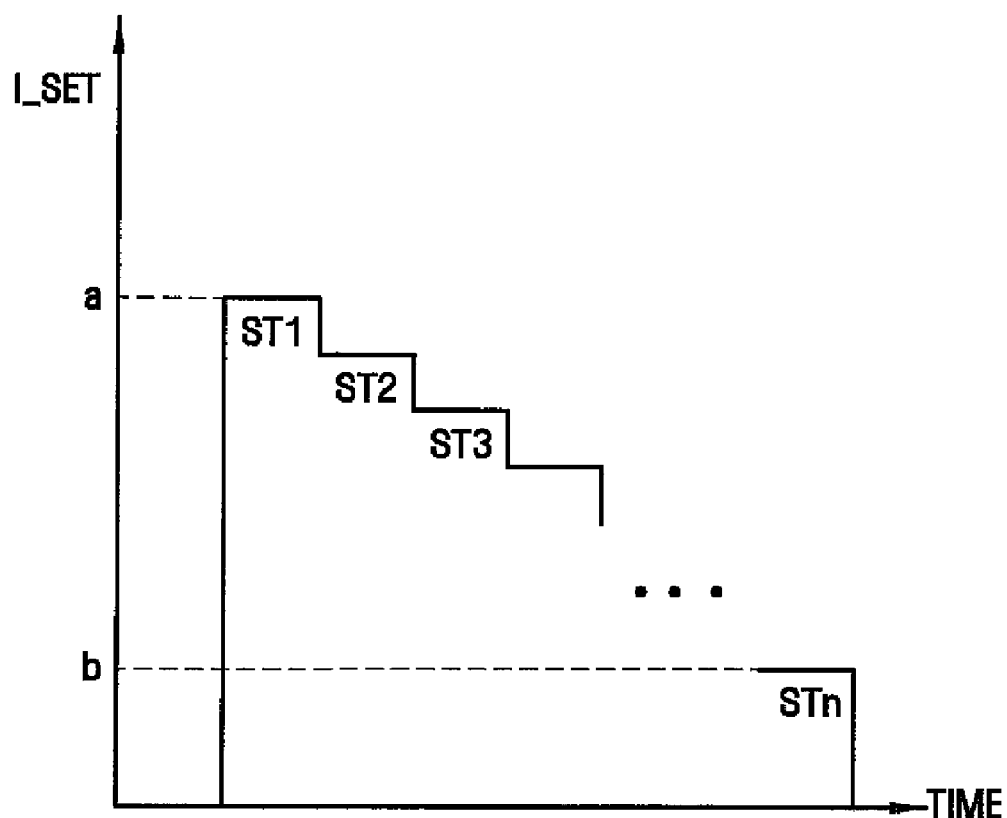
FIG. 5 is a graph illustrating one of the set pulses illustrated in FIGS. 2 through 4 in further detail.

FIGS. 2 through 4 are diagrams illustrating examples of set pulses used in a PRAM device according to selected embodiments of the invention, and FIG. 5 is a graph illustrating in detail one of the set pulses illustrated in FIGS. 2 through 4.

Referring to FIGS. 2 through 5, a set pulse I_SET used in a PRAM device according to an embodiment of the present invention comprises first through n-th stages ST1 through STn. For example, in FIGS. 2 through 4, n=30. First stage ST1 corresponds to a first magnitude "a", n-th stage STn corresponds to a second magnitude "b", and the magnitude of set pulse I_SET decreases from "a" to "b" throughout the first through n-th stages. The terms "first magnitude 'a'" and "second magnitude 'b'" will be used in this written description to refer generally to current magnitudes of first and last stages of set pulses; however, the actual values of first magnitude "a" and second magnitude "b" will vary in different write loops, as will be explained in further detail below.

A plurality of set pulses I_SET corresponding to different first and second magnitudes "a" and "b" may be respectively provided during the write loops (L=1-11). In general, first and second magnitudes "a" and "b" tend to increase across successive write loops.

Referring to set pulses I_SET illustrated in FIG. 2, first magnitude "a" increases across successive write loops, while second magnitude "b" stays substantially the same across write loops. The magnitude of set pulse I_SET for the first write loop (L=1) ranges in steps from 0.5 mA to 0 mA across stages, and the magnitude of set pulse I_SET for the second write loop (L=2) ranges steps from 0.55 mA to 0 mA across stages.

Referring to set pulses I_SET illustrated in FIG. 3, first magnitude "a" stays substantially the same across write loops while second magnitude "b" increases across successive write loops. The magnitude of set pulse I_SET for the first write loop (L=1) ranges in steps from 1.0 mA to 0 mA across stages, and the magnitude of set pulse I_SET for the second write loop (L=2) ranges in steps from 1.0 mA to 0.5 mA across stages.

Referring to set pulses I_SET illustrated in FIG. 4, first and second magnitudes "a" and "b" both increase across successive write loops. The magnitude of set pulse I_SET for the first write loop (L=1) ranges in steps from 0.5 mA to 0 mA across stages, and the magnitude of set pulse I_SET for the second write loop (L=2) ranges in steps from 0.55 mA to 05 mA across stages. In FIG. 4, first magnitude "a" and second magnitude "b" change by substantially the same amount with each successive write loop; however, the amounts of the respective changes could be varied in a variety of ways without departing from the scope of the invention.

Set pulses I_SET illustrated in FIGS. 2 through 4 have a uniform pulse width regardless of whether the number of write loops increases; however, the pulse widths could also be modified to be non-uniform. Referring to set pulses I_SET illustrated in FIGS. 2 through 4, first magnitude "a" and second magnitude "b" increase by a predetermined amount, e.g., 05 mA across successive write loops; however, these magnitudes could also be increased by non-uniform amounts. Referring to FIG. 2, second magnitude "b" is about 0 mA; however, second magnitude "b" could also be modified for different write loops. Referring to FIG. 3, first magnitude "a" is about 1.0 mA; however, first magnitude "a" could also be modified for different write loops. Set pulses I_SET illustrated in FIGS. 2 through 4 each comprise thirty stages; however, this number of stages could be modified.

There are several reasons for increasing the magnitude of set pulse I_SET in successive write loops. For example, PRAM cells in a memory cell array may have different parasitic loads based on their locations, and bitlines or wordlines coupled to the PRAM cells may also have different loads. Accordingly, the magnitude of currents required to write data to PRAM cells may vary according to the locations of the PRAM cells within the memory cell array.

Once the phase-change material of a PRAM cell is changed into the set state, the PRAM cell remains in the set state as long as no current greater than that required to re-write the PRAM cell is applied to the phase-change material.

Figure 6:
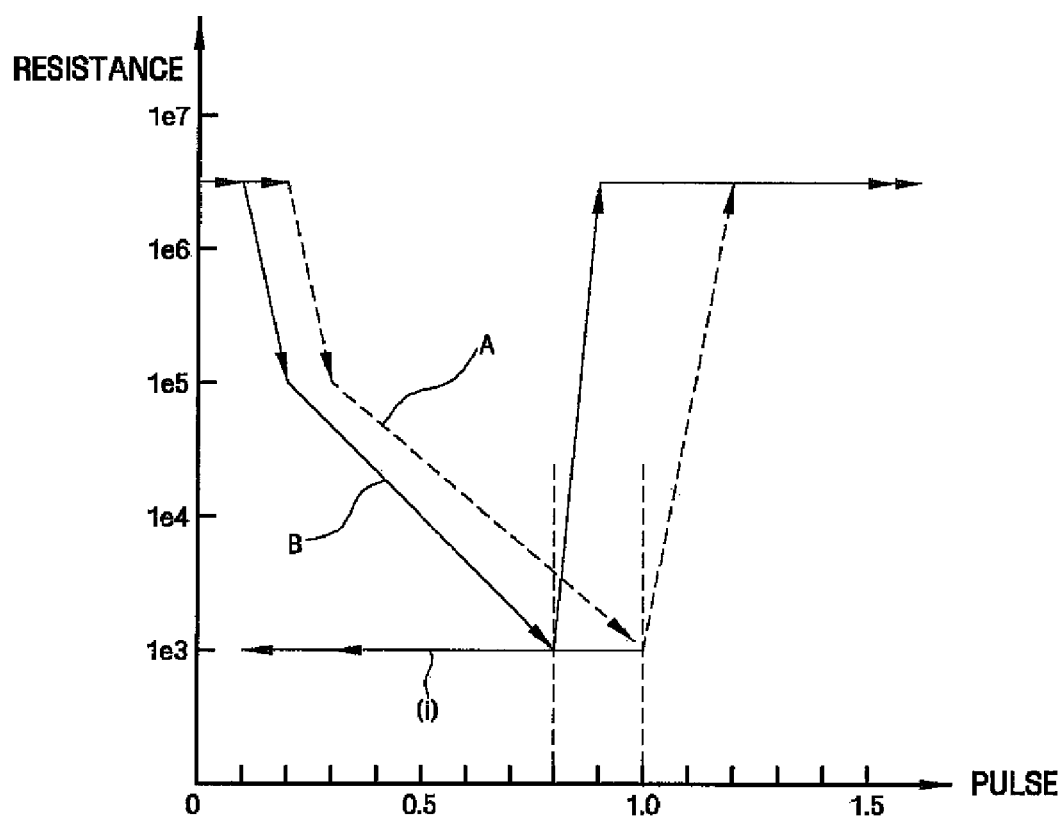
FIG. 6 is a graph illustrating a relationship between the resistance of a phase-change material and current flowing through the phase-change material.

FIG. 6 illustrates the relationship between the magnitude of current applied to the phase-change material in a PRAM cell and the resistance of the PRAM cell. Referring to FIG. 6, as the magnitude of a pulse current provided to a PRAM cell "A" increases, the resistance of PRAM cell "A" decreases. Where the magnitude of the pulse current provided to PRAM cell "A" is about 1.0 mA, the resistance of PRAM cell "A" reaches a minimum. On the other hand, where the magnitude of the pulse current provided to PRAM cell "A" exceeds 1.0 mA, the resistance of the PRAM cell "A" gradually increases.

Where the magnitude of the pulse current provided to PRAM cell "A" exceeds about 1.2 mA, the resistance of PRAM cell "A" reaches a maximum, and is saturated. Where the magnitude of the pulse current provided to PRAM cell "A" decreases after the resistance of PRAM cell "A" reaches its maximum, then the resistance of PRAM cell "A" may decrease. However, as the magnitude of the pulse current provided to PRAM cell "A" decreases in a range below 1.0 mA (to the left of the dotted vertical lines in FIG. 6), the resistance of PRAM cell "A" does not increase but stays substantially the same, as indicated by (i) in FIG. 6.

Assuming that the state of PRAM cell "A" where the pulse current provided to PRAM cell "A" is 1.0 mA is the "set" state, the PRAM cell "A" maintains the "set" state even when the pulse current provided to the PRAM cell "A" increases and then decreases. This also applies to a PRAM cell "B". Referring to FIG. 6, PRAM cell "A" and PRAM cell "B" require different amounts of current to be placed in a set resistance state because of the difference between the parasitic loads of PRAM cell "A" and PRAM cell "B" or the difference between the loads of a pair of bitlines or wordlines respectively coupled to PRAM cell "A" and PRAM cell "B".

By utilizing the aforementioned characteristics of phase-change materials in PRAM cells, a set pulse I_SET can be designed with a plurality of stages sequentially decreasing from first magnitude "a" to second magnitude "b" as described above such that even where different PRAM cells require set pulse currents with different magnitudes in order to be "set", it is possible to effectively "set" all the PRAM cells using the different stages.

Where a write operation fails in an attempt to write data to a PRAM cell using set pulse I_SET in an n-th write loop (L=n where "n" is a natural number), set pulse I_SET is applied to the PRAM cell with a higher magnitude during an (n+1)-th write loop (L=n+1). One reason for applying set pulse I_SET to the PRAM cell with a higher magnitude in the (n+1)-th write loop is that the PRAM cell will not be properly programmed unless the magnitude of set pulse I_SET is sufficiently high, as illustrated by FIG. 6. In other words, the magnitude of set pulse I_SET is adjusted in successive write loops in attempt to avoid further write failures.

Figure 7A:
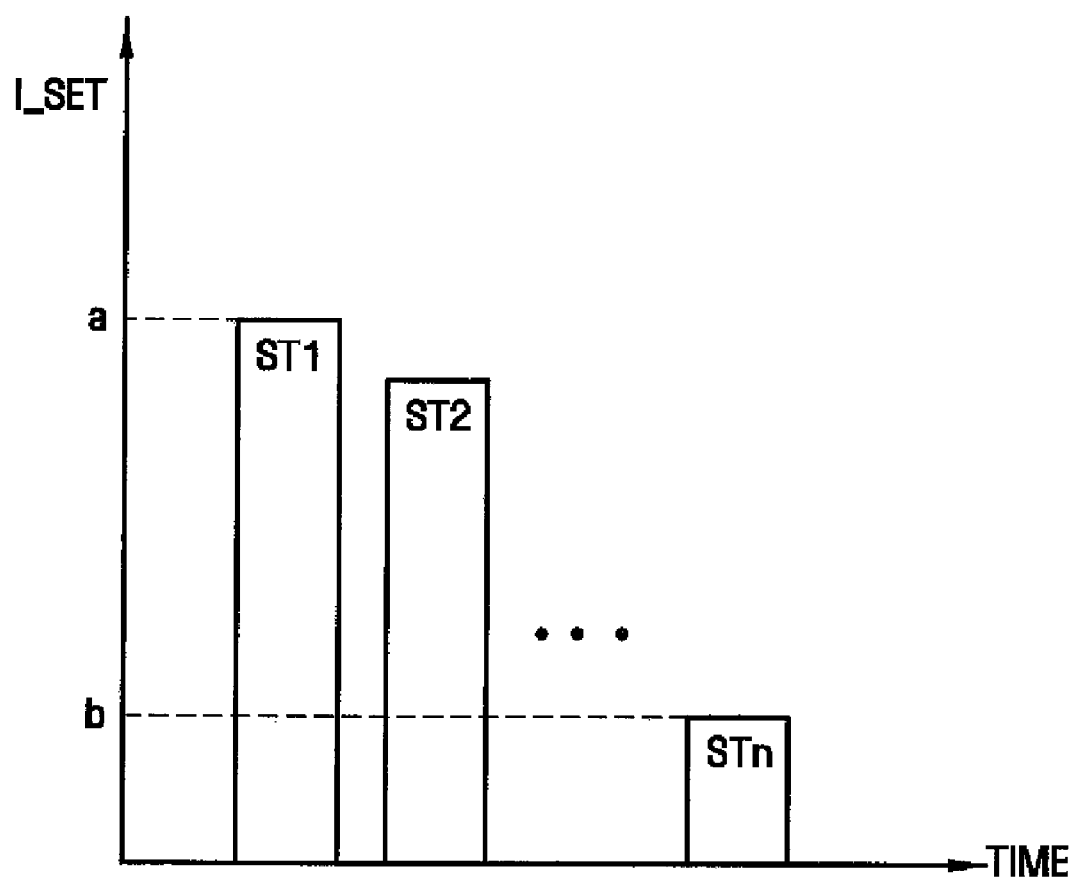
FIG. 7A is a graph illustrating a set pulse used in a write operation of a PRAM device according to another embodiment of the invention.
Figure 7B:
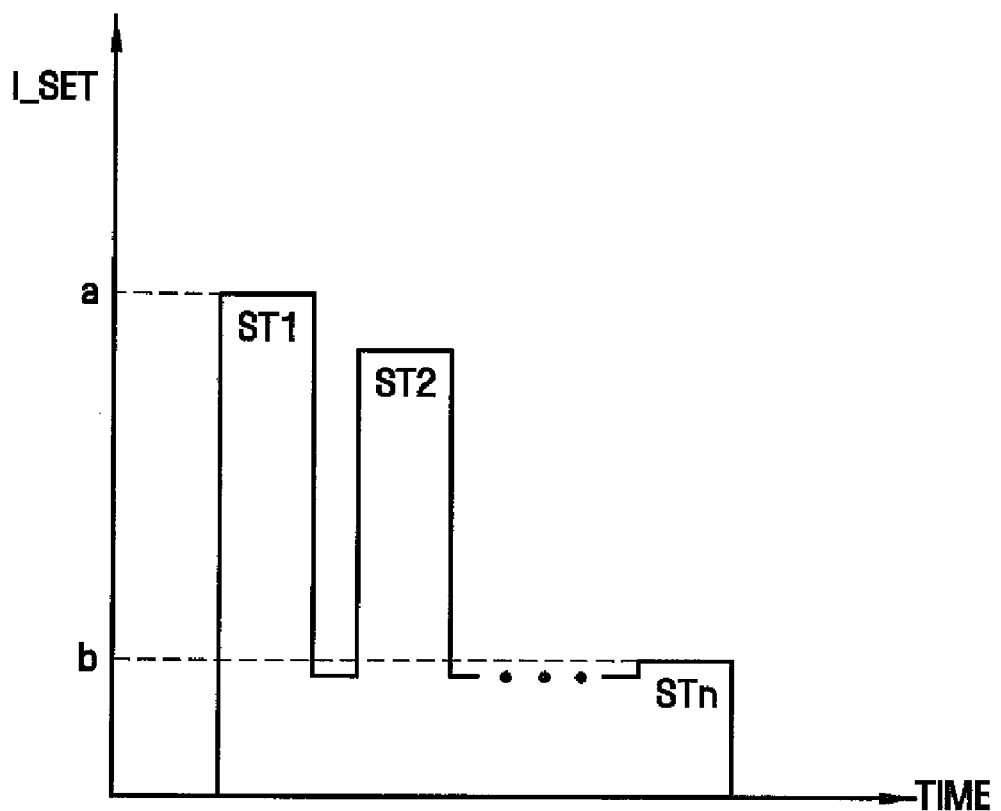
FIG. 7B is a graph illustrating a set pulse used in a write operation of a PRAM device according to another embodiment of the invention.

FIGS. 7A and 7B are graphs illustrating set pulses I_SET used in PRAM devices according to other embodiments of the invention. The set pulses I_SET illustrated in respective FIGS. 7A and 7B each comprise a plurality of stages ST1 through STn, and a plurality of sections before and between stages ST1 through STn having substantially the same current magnitude.

In the set pulse I_SET illustrated in FIG. 7A, each of the sections has a current magnitude of approximately 0 mA. In the set pulse I_SET illustrated in FIG. 7B, each of the sections has a current magnitude greater than 0 mA. In the embodiments illustrated in FIGS. 7A and 7B, like the embodiments illustrated in FIGS. 2 through 4, first and second magnitudes "a" and "b" may vary from one write loop to another.

Figure 8:
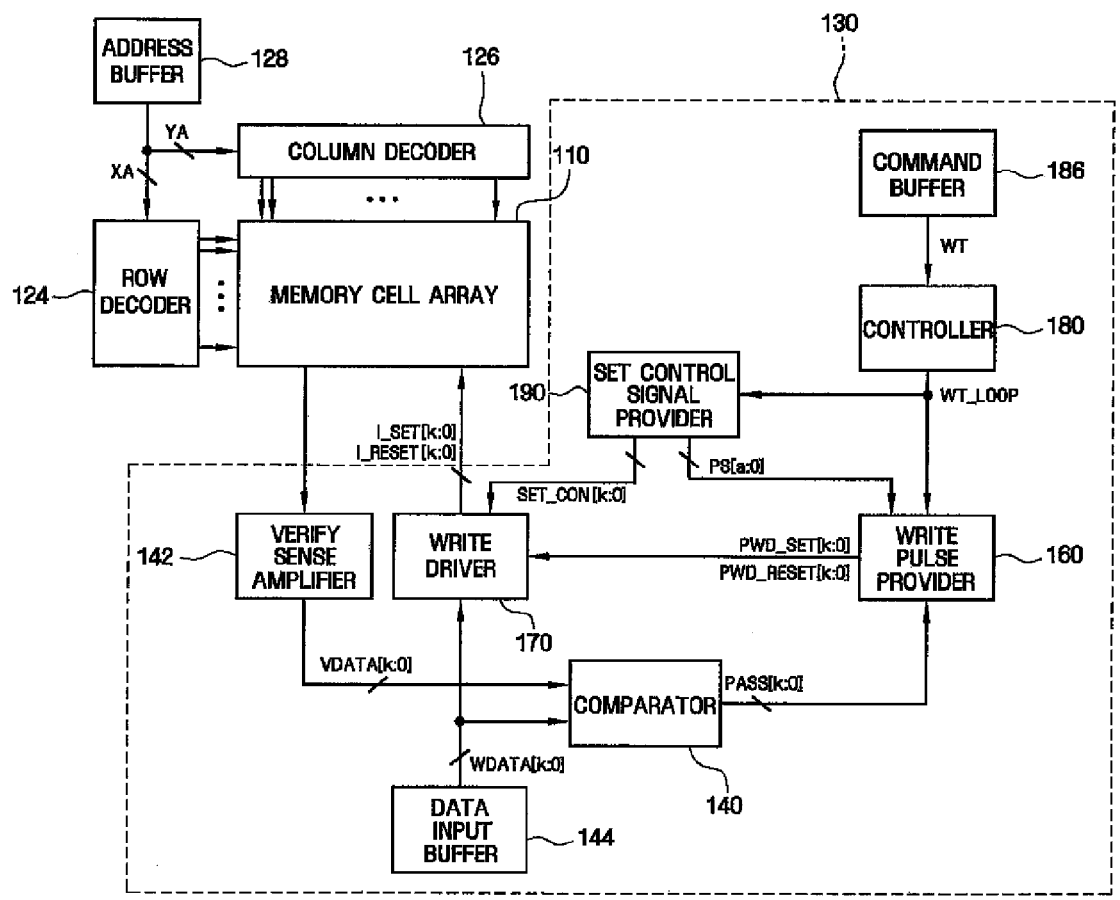
FIG. 8 is a block diagram of a PRAM device according to an embodiment of the present invention.

FIG. 8 is a block diagram of a PRAM device according to an embodiment of invention. The PRAM device uses set and reset pulses I_SET and I_RESET to perform write operations. For explanation purposes, it will be assumed that the magnitude of set pulse I_SET increases with successive write loops but the magnitude of reset pulse I_RESET does not increase with successive write loops.

Referring to FIG. 8, the PRAM device comprises a memory cell array 110, a row decoder 124, a column decoder 126, an address buffer 128, and a write circuit 130.

Memory cell array 110 comprises a plurality of PRAM cells that can be divided into one or more cell groups. Row decoder 124 receives a row address XA from address buffer 128, and determines a row of PRAM cells to which data is to be written by decoding row address XA. Column decoder 126 receives a column address YA from address buffer 128, and determines a column of PRAM cells by decoding column address YA.

Write circuit 130 writes data to a plurality of failed PRAM cells by applying set pulse I_SET or reset pulse I_RESET to the failed PRAM cells in a plurality of write loops. Set pulse I_SET comprises a plurality of stages sequentially decreasing from a first magnitude to a second magnitude, as illustrated, for example, in FIGS. 2 through 4. In selected embodiments, the first magnitude increases across successive write loops. In other selected embodiments, the first and second magnitudes both increase across successive write loops.

Write circuit 130 comprises a comparator 140, a verify sense amplifier 142, a data input buffer 144, a write pulse provider 160, a write driver 170, a controller 180, a command buffer 186, and a set control signal provider 190.

Comparator 140 compares verification data VDATA read out from a plurality of selected PRAM cells by verify sense amplifier 142 in a verify read operation with write data WDATA input to comparator 140 by data input buffer 144, and outputs comparison signals PASS with respective logic states based on the comparison. Comparison signals PASS indicate which of "k" selected PRAM cells are failed PRAM cells storing verification data different from write data WDATA.

Controller 180 receives a write command, and provides write pulse provider 160 and set control signal provider 190 with a write loop signal WT_LOOP corresponding to an n-th write loop ("n" is a natural number) for writing data to a plurality of failed PRAM cells. Controller 180 may control a write operation by providing an operation enable signal (not shown) to write pulse provider 160, set control signal provider 190, verify sense amplifier 142, and write driver 170.

Set control signal provider 190 receives write loop signal WT_LOOP provided by controller 180, and provides a set control signal SET_CON comprising a plurality of sequential stages decreasing from a first voltage to a second voltage. The first voltage and the second voltage vary from one write loop to another. The waveform of the set control signal SET_CON is similar to the waveform of set pulses I_SET illustrated in FIGS. 2 through 4. For example, the first voltage may increase with successive write loops, or the first and second voltages may both increase with successive write loops.

Like set pulses I_SET illustrated in FIGS. 7A and 7B, set control signal SET_CON may comprise a plurality of sections having a predetermined voltage and placed among the stages. Set control signal provider 190 sequentially provides a plurality of control pulses PS whose active periods do not coincide. The structure and operation of set control signal provider 190 is described below in further detail with reference to FIG. 9.

Write pulse provider 160 receives comparison signal PASS, write loop signal WT_LOOP, and control pulses PS, and provides a set pulse width control signal PWD_SET and a reset pulse width control signal PWD_RESET. Set pulse width control signal PWD_SET is activated when first control pulse PS is activated, and is inactivated when last control pulse PS is inactivated.

Write driver 170 receives the write data, set control signal SET_CON, set pulse width control signal PWD_SET, and reset pulse width control signal PWD_RESET, and writes the write data WDATA to at least one failed PRAM cell by applying set pulse I_SET or reset pulse I_RESET. Where write data WDATA is set data, write driver 170 provides set pulse I_SET comprising a plurality of stages sequentially decreasing from the first magnitude to the second magnitude in as many steps as there are stages during the active period of the set pulse width control signal PWD_SET. Here, the first current and the second current may vary from one write loop to another. On the other hand, where write data WDATA comprises reset data, write driver 170 provides a reset pulse I_RESET during the active period of reset pulse width control signal PWD_RESET. The structure of write driver 170 is illustrated in detail in FIG. 13.

Figure 9:
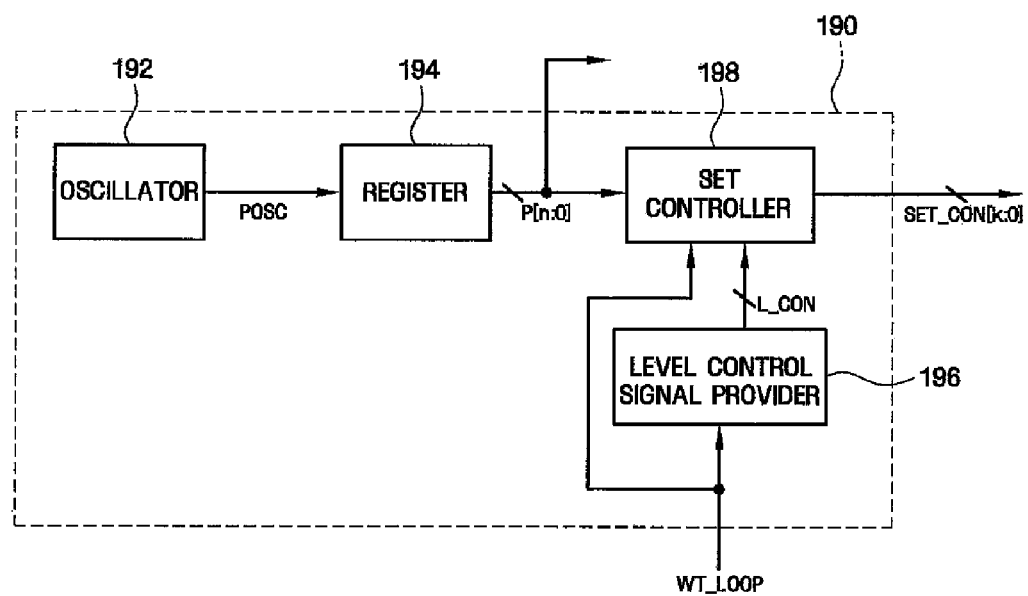
FIG. 9 is a block diagram of a set control signal provider illustrated in FIG. 8.

FIG. 9 is a block diagram of set control signal provider 190 illustrated in FIG. 8. Referring to FIG. 9, set control signal provider 190 includes an oscillator 192, a register 194, a level control signal provider 196, and a set controller 198.

Oscillator 192 provides a clock signal POSC. Register 192 receives clock signal POSC and sequentially provides a plurality of control pulses PS whose active periods do not coincide in response to clock signal POSC.

Level control signal provider 196 receives a write loop signal WT_LOOP corresponding to an n-th write loop, and provides a level control signal corresponding to the n-th write loop. Level control signal provider 196 may provide the level control signal corresponding to the n-th write loop in various manners. For example, level control signal provider 196 may store a plurality of level control signals respectively corresponding to a plurality of write loops in a memory. Where write loop signal WT_LOOP corresponding to the n-th write loop is input, level control signal provider 196 may read the level control signal corresponding to the n-th write loop from the memory, and output the level control signal corresponding to the n-th write loop. Alternatively, level control signal provider 196 may decode write loop signal WT_LOOP corresponding to the n-th write loop, generate a level control signal corresponding to the n-th write loop based on the result of the decoding, and output the level control signal.

Set controller 198 sequentially receives control pulses PS, and generates a set control signal SET_CON comprising a plurality of stages sequentially decreasing from a first voltage to a second voltage. Also, set controller 198 receives a level control signal L_CON, and varies the first voltage or the second voltage in response to the level control signal L_CON.

Various examples of ways to implement set controller 198 are described below with reference to FIGS. 10 through 12.

Figure 10:
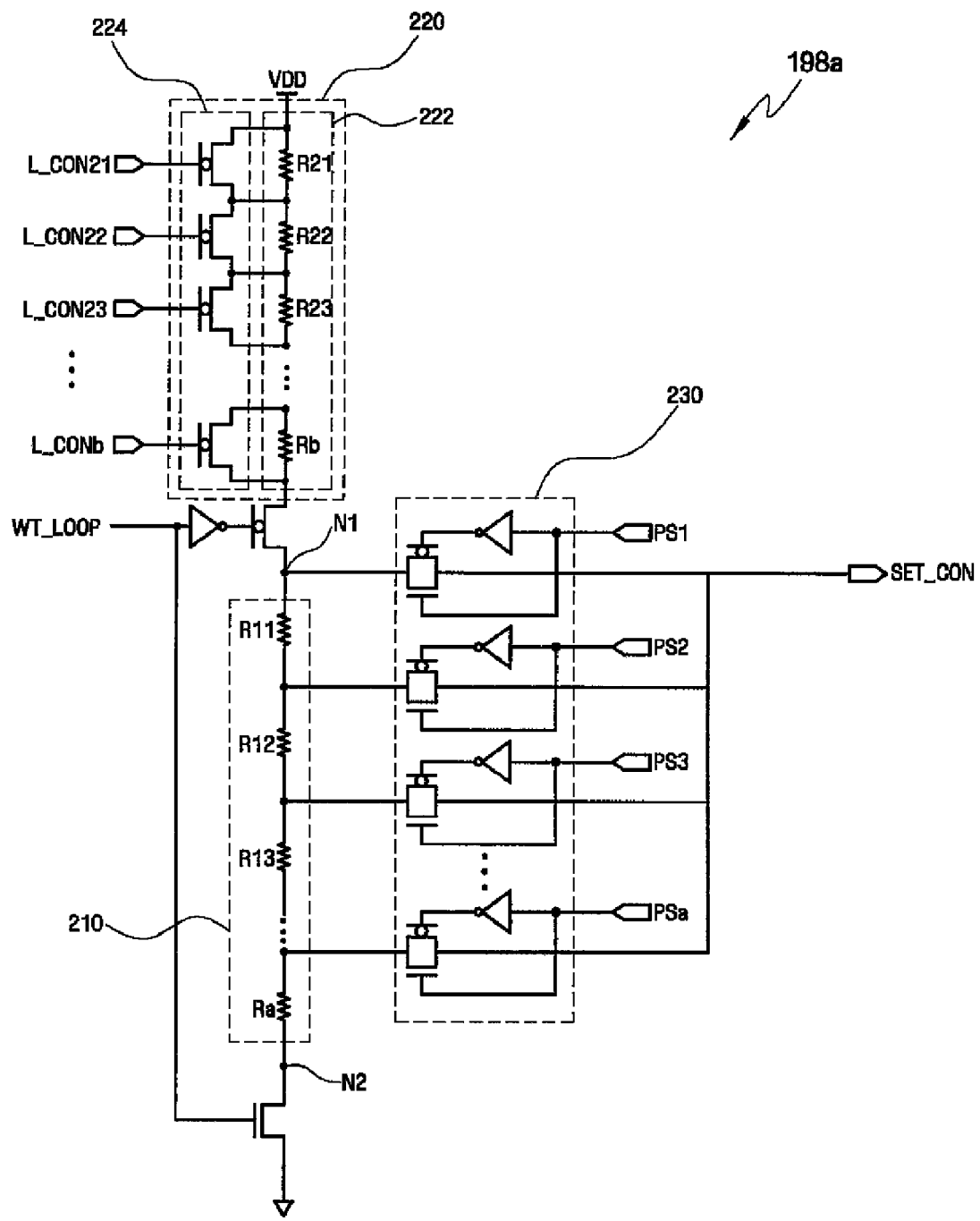
FIGS. 10 through 12 are circuit diagrams illustrating various implementations of a set controller illustrated in FIG. 9.

FIG. 10 is a circuit diagram of one example of set controller 198 illustrated in FIG. 9, i.e., a set controller 198a generating a set control signal SET_CON for generating set pulses I_SET illustrated in FIG. 2. Referring to FIG. 10, set controller 198a comprises a first resistor string 210 comprising a plurality of resistors R11 through Ra connected in series between a first node N1 and a second node N2, a first voltage level adjuster 220 receiving a plurality of level control signals L_CON21 through L_CONb and adjusting the voltage of first node N1, and a transmitter 230 sequentially receiving a plurality of control pulses PS and sequentially outputting a plurality of node voltages among resistors R11 through Ra in first resistor string 210.

First voltage level adjuster 220 comprises a second resistor string 222 comprising a plurality of resistors R21 through Rb connected in series between first node N1 and a power supply VDD, and a plurality of PMOS transistors 224 respectively connected to a plurality of nodes located among resistors R21 through Rb in second resistor string 222 and selectively turned on in response to level control signals L_CON21 through L_CONb.

Figure 11:
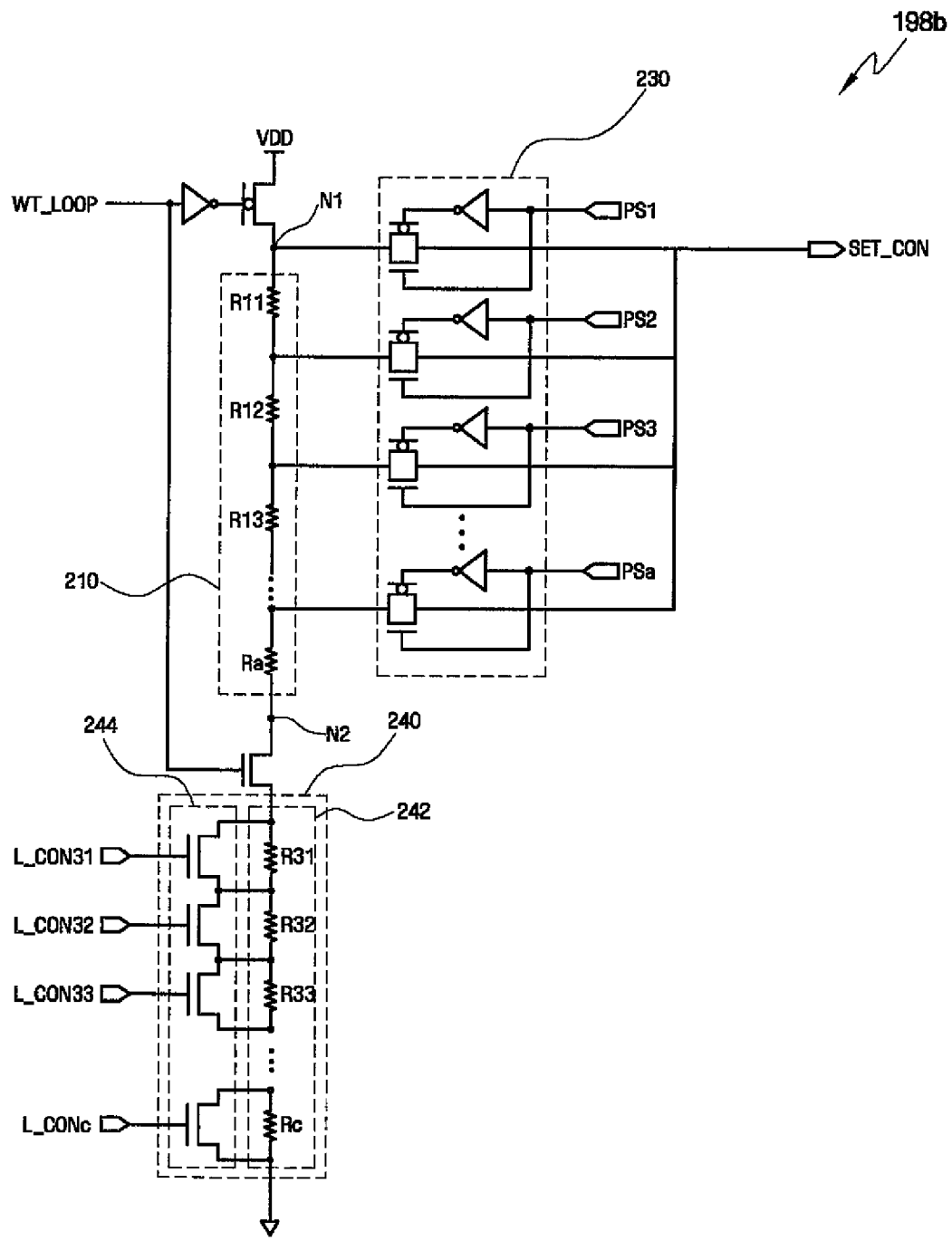

FIG. 11 is a circuit diagram of another example of set controller 198 illustrated in FIG. 9, i.e., a set controller 198b generating a set control signal SET_CON for generating set pulses I_SET illustrated in FIG. 3. Referring to FIG. 11, set controller 198b comprises a first resistor string 210 comprising a plurality of resistors R11 through Ra connected in series between a first node N1 and a second node N2, a second voltage level adjuster 240 provided with a plurality of level control signals L_CON31 through L_CONc and adjusts the voltage of second node N2; and a transmitter 230 which is sequentially provided with a plurality of control pulses PS and sequentially outputs a plurality of node voltages among the resistors R11 through Ra in first resistor string 210.

Second voltage level adjuster 240 comprises a third resistor string 242 comprising a plurality of resistors R31 through Rc connected in series between second node N1 and ground VSS, and a plurality of NMOS transistors 224 respectively connected to a plurality of nodes located among resistors R31 through Rc in third resistor string 242 and selectively turned on in response to level control signals L_CON31 through L_CONc.

Figure 12:
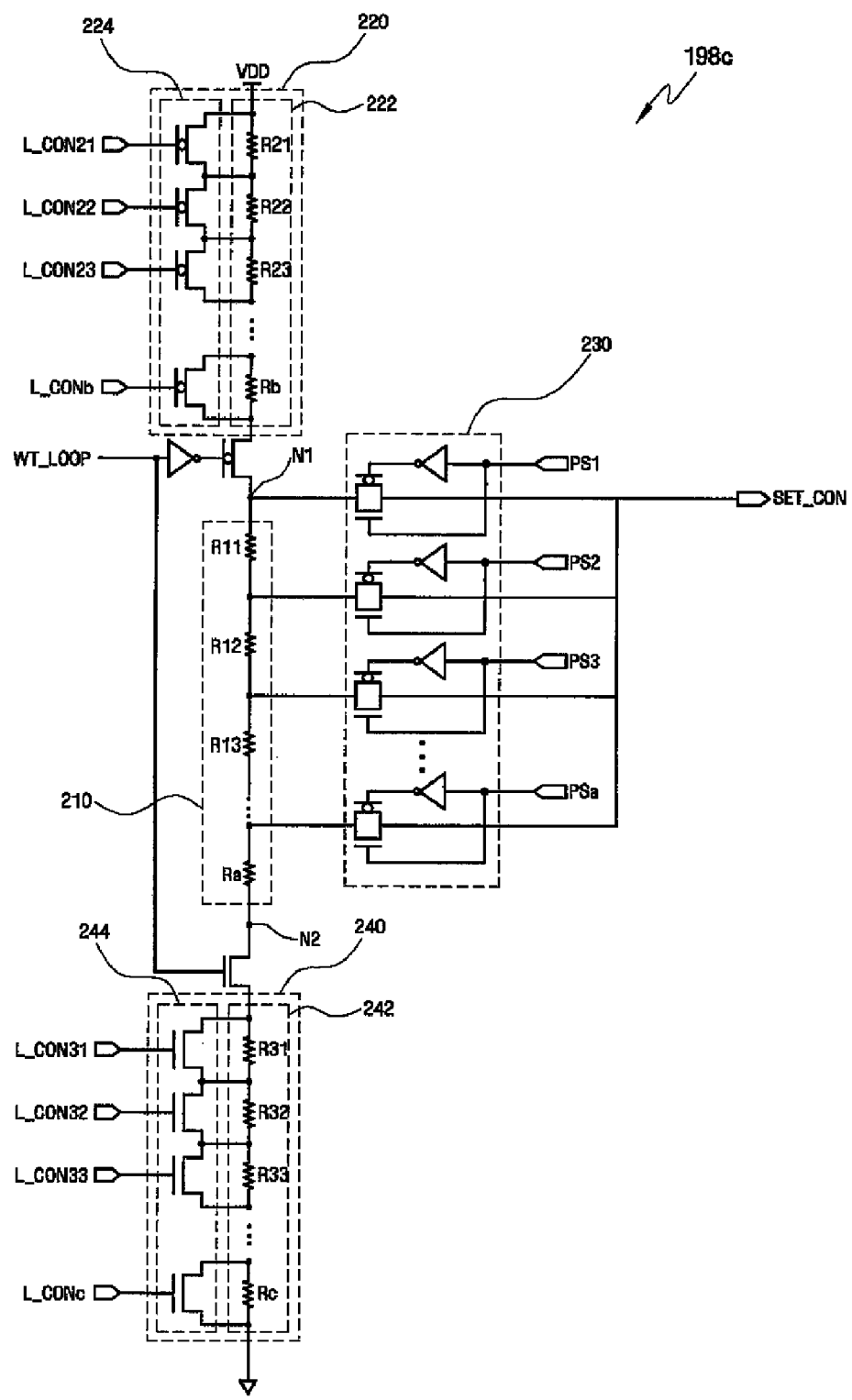

FIG. 12 is a circuit diagram of another example of set controller 198 illustrated in FIG. 9, i.e., a set controller 198c generating a set control signal SET_CON for generating set pulses I_SET illustrated in FIG. 4.

Referring to FIG. 12, set controller 198c comprises a first resistor string 210 comprising a plurality of resistors R11 through Ra connected in series between a first node N1 and a second node N2, a first voltage level adjuster 220 provided with a plurality of level control signals L_CON21 through L_CONb and adjusting the voltage of first node N1, a second voltage level adjuster 240 provided with a plurality of level control signals L_CON31 through L_CONc and adjusting the voltage of second node N2, and a transmitter 230 sequentially provided with a plurality of control pulses PS and sequentially outputting a plurality of node voltages among resistors R11 through Ra in first resistor string 210. The structure of first voltage level adjuster 220 is the same as that of first voltage level adjuster 220 illustrated in FIG. 10, and the structure of second voltage level adjuster 240 is the same as that of second voltage level adjuster 240 illustrated in FIG. 11.

Figure 13:
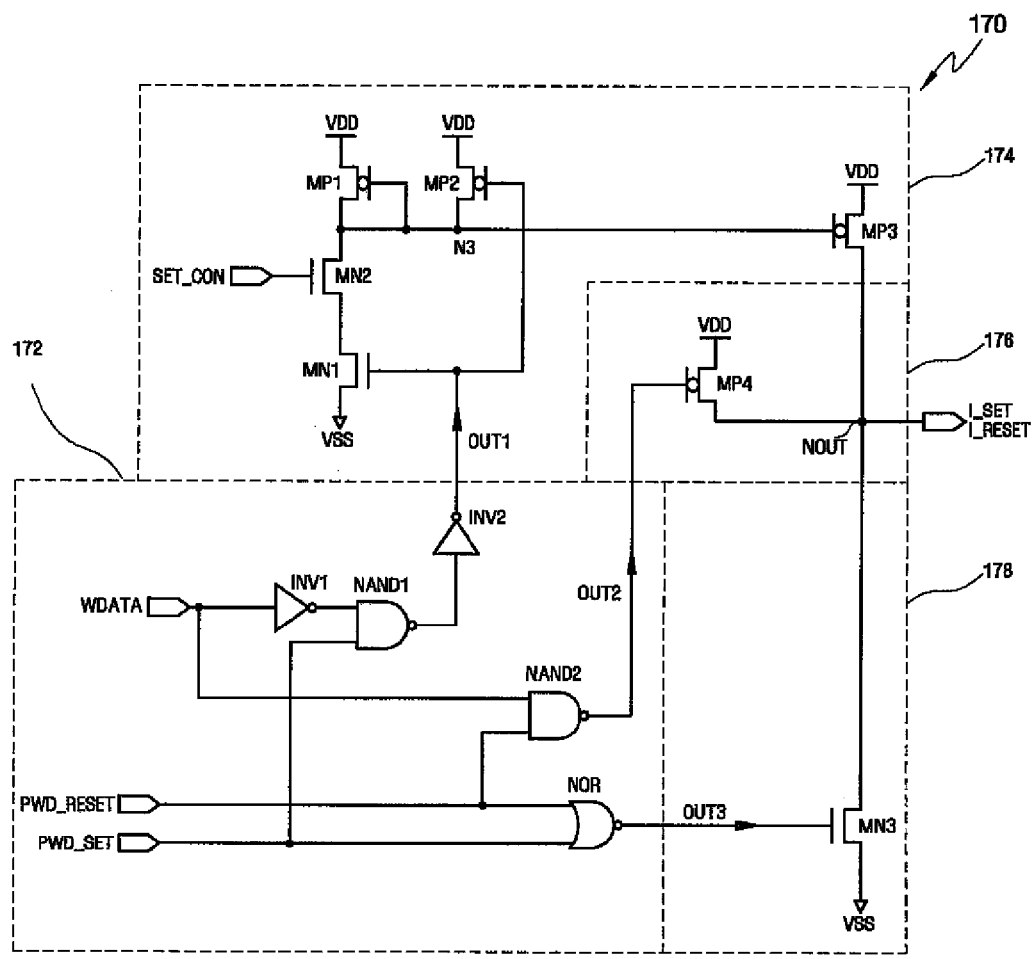
FIG. 13 is a circuit diagram of a write driver illustrated in FIG. 8.

FIG. 13 is a circuit diagram of write driver 170 illustrated in FIG. 8. Referring to FIG. 13, write driver 170 comprises a write driver controller 172, a set pulse driver 174, a reset pulse driver 176, and a pull-down unit 178.

Write driver controller 172 receives write data WDATA, a set pulse width control signal PWD_SET, and a reset pulse width control signal PWD_RESET, and generates first, second, and third output signals OUT1, OUT2, and OUT3 for respectively controlling set pulse driver 174, reset pulse driver 176, and pull-down unit 178. Write driver controller 172 may comprise a plurality of inverters INV1 and INV2, a plurality of NAND gates NAND1 and NAND2, and a NOR gate NOR. First output signal OUT1 is generated by performing a NAND operation on an inverted version of write data WDATA and set pulse width control signal PWD_SET and inverting the result of the NAND operation. Second output signal OUT2 is generated by performing a NAND operation on write data WDATA and reset pulse width control signal PWD_RESET. Third output signal OUT3 is generated by performing a NOR operation on reset pulse width control signal PWD_RESET and set pulse width control signal PWD_SET.

Set pulse driver 174 receives set control signal SET_CON and first output signal OUT1, and provides a set pulse I_SET. Set pulse driver 174 comprises a plurality of NMOS transistors MN1 and MN2, and a plurality of PMOS transistors MP1, MP2, and MP3.

Reset pulse driver 176 receives second output signal OUT2, and generates a reset pulse I_RESET. Reset pulse driver 176 comprises a PMOS transistor MP4 turned on in response to second output signal OUT2.

Pull-down unit 178 receives third output signal OUT3, and pulls down the voltage of an output node NOUT. Pull-down unit 178 comprises an NMOS transistor MN3 turned on in response to third output signal OUT3. The current driving capability of the NMOS transistor MN3 is greater than current driving capability of the PMOS transistors MP3 and MP4.

The operation of write driver 170 where write data WDATA to be written to a PRAM cell is set data is described in further detail below.

In this case, write data WDATA has a low level and set pulse width control signal PWD_SET has a high level. Thus, NAND gate NAND1 outputs a signal having a low level, and the signal output by the NAND gate NAND1 is converted into a first output signal OUT1 having a high level by the inverter INV2. Then, NMOS transistor MN1 is turned on and the PMOS transistor MP2 is turned off. Also, the NAND gate NAND2 outputs a second output signal OUT2 having a high level. Then, PMOS transistor MP4 is turned off. The NOR gate NOR outputs a third output signal OUT3 having a low level. Then, the NMOS transistor MN3 is turned off.

Where a set control signal SET_CON comprising a plurality of stages sequentially decreasing from a first voltage to a second voltage is input in the aforementioned situation, then the degree to which the NMOS transistor MN2 is turned on may be varied according to the voltage of the set control signal SET_CON. Here, the first or second voltage may vary from one write loop to another. As a result, the voltage level of node N3 is varied, and the extent to which PMOS transistor MP3 is turned on is varied. In other words, a set pulse I_SET whose waveform is the same as or similar to the waveform of set control signal SET_CON is output.

As described above, selected embodiments of the invention provide PRAM devices with improved reliability by selectively modifying the respective magnitudes of current pulses used to perform write operations. For example, the magnitude of a set pulse can be decreased between a first magnitude to a second magnitude across different stages or different write loops of a write operation.

The foregoing exemplary embodiments are teaching examples. Those of ordinary skill in the art will understand that various changes in form and details may be made to the exemplary embodiments without departing from the scope of the invention as defined by the following claims.

What is claimed is:

1. A phase-change random access memory (PRAM) device, comprising:
    a register configured to sequentially generate a plurality of control pulses having respective active periods that do not coincide;
    a level control signal provider receiving a write loop signal indicating an n-th write loop, and providing a level control signal corresponding to the n-th write loop;
    a set controller sequentially receiving the control pulses and receiving the level control signal, generating a set control signal comprising a plurality of stages sequentially decreasing from a first voltage level to a second voltage level and varying the first voltage level or the second voltage level in response to the level control signal; and
    a write driver providing a set pulse where write data to be written in the PRAM device is set data, and providing a reset pulse where the write data is reset data, the set pulse comprising a plurality of stages sequentially decreasing from a first current magnitude to a second current magnitude, wherein the first or second current magnitude varies from one write loop to another.

2. The device of claim 1, wherein the set controller comprises:
    a first resistor string comprising a plurality of resistors connected in series between a first node and a second node;
    a voltage level adjuster receiving the level control signal and adjusting a voltage level of the first node or the second node; and
    a transmitter sequentially receiving the control pulses and sequentially outputting a plurality of node voltages to nodes among the resistors in the first resistor string.

3. The device of claim 2, wherein the voltage level adjuster comprises:
    a second resistor string comprising a plurality of resistors connected in series between the first node and a power supply; and
    a plurality of positive metal-oxide semiconductor (PMOS) transistors respectively connected to a plurality of nodes located among the resistors in the second resistor string and selectively turned on in response to the level control signal.

4. The device of claim 2, wherein the voltage level adjuster comprises:
    a third resistor string comprising a plurality of resistors connected in series between the second node and ground; and
    a plurality of negative metal-oxide semiconductor (NMOS) transistors respectively connected to a plurality of nodes located among the resistors in the third resistor string and selectively turned on in response to the level control signal.

5. The device of claim 2, wherein the voltage level adjuster comprises:
    a second resistor string comprising a plurality of resistors connected in series between the first node and a power supply;
    a third resistor string comprising a plurality of resistors connected in series between the second node and ground;
    a plurality of positive metal-oxide semiconductor (PMOS) transistors respectively connected to a plurality of nodes located among the resistors in the second resistor string and selectively turned on in response to the level control signal; and
    a plurality of negative metal-oxide semiconductor (NMOS) transistors respectively connected to a plurality of nodes located among the resistors in the third resistor string and selectively turned on in response to the level control signal.

* * * * *